(12) United States Patent
Zijlmans et al.

(10) Patent No.: US 11,162,173 B2
(45) Date of Patent: Nov. 2, 2021

(54) ATOMIC LAYER DEPOSITION APPARATUS

(71) Applicant: SMIT THERMAL SOLUTIONS B.V., Son (NL)

(72) Inventors: Wiro Rudolf Zijlmans, Son (NL); Martin Dinant Bijker, Helmond (NL); Ernst Dullemeijer, Budel (NL); Guido Lijster, Eindhoven (NL)

(73) Assignee: SMIT THERMAL SOLUTIONS B.V., Son (NL)

( * ) Notice: Subject to any disclaimer, the term of this patent is extended or adjusted under 35 U.S.C. 154(b) by 467 days.

(21) Appl. No.: 15/543,855

(22) PCT Filed: Jan. 14, 2016

(86) PCT No.: PCT/NL2016/050033
§ 371 (c)(1),
(2) Date: Jul. 14, 2017

(87) PCT Pub. No.: WO2016/114664
PCT Pub. Date: Jul. 21, 2016

(65) Prior Publication Data
US 2017/0362707 A1 Dec. 21, 2017

(30) Foreign Application Priority Data
Jan. 14, 2015 (NL) .................................... 2014134

(51) Int. Cl.
*C23C 16/455* (2006.01)
*C23C 16/458* (2006.01)
(Continued)

(52) U.S. Cl.
CPC .... *C23C 16/45544* (2013.01); *C23C 16/4585* (2013.01); *C23C 16/4586* (2013.01);
(Continued)

(58) Field of Classification Search
CPC .......... C23C 16/45551; C23C 16/4585; C23C 16/545
See application file for complete search history.

(56) References Cited

U.S. PATENT DOCUMENTS

| | | | | |
|---|---|---|---|---|
| 4,818,838 A | * | 4/1989 | Young | H01J 37/301 219/121.12 |
| 2001/0031608 A1 | * | 10/2001 | Dvir | B24B 37/345 451/6 |

(Continued)

FOREIGN PATENT DOCUMENTS

| | | |
|---|---|---|
| EP | 2 441 860 A1 | 4/2012 |
| NL | 2010893 C | 12/2014 |
| WO | 2014/193234 A1 | 12/2014 |

OTHER PUBLICATIONS

International Search Report, dated Jun. 14, 2016, from corresponding PCT application No. PCT/NL2016/050033.

*Primary Examiner* — Karla A Moore
*Assistant Examiner* — Nathan K Ford
(74) *Attorney, Agent, or Firm* — Nixon & Vanderhye (57) ABSTRACT

Disclosed is apparatus for atomic layer deposition including a frame, an injector head with longitudinal slots supplying gases to deposition spaces confined by the longitudinal slots and a substrate. The slots are transverse to a movement in a first direction of the substrate, a subframe suspending the injector head; a movable carrier supporting the substrate for movement in the first direction; and gas pads at the subframe outside the injector head between the subframe and the moveable carrier, bearing the subframe on the carrier for the movement in the first direction. Actuators suspend the injector head from the subframe, and a control device connected to the actuators controls the actuators to adjust a working distance between a reference plane of the injector head and the surface of the substrate corresponding to a (Continued)

predetermined distance and to adjust an orientation of the injector head corresponding to an orientation of the substrate.

17 Claims, 6 Drawing Sheets

(51) Int. Cl.
*C23C 16/52* (2006.01)
*C23C 16/54* (2006.01)

(52) U.S. Cl.
CPC ........ *C23C 16/45551* (2013.01); *C23C 16/52* (2013.01); *C23C 16/545* (2013.01)

(56) References Cited

U.S. PATENT DOCUMENTS

| | | | |
|---|---|---|---|
| 2006/0042939 A1* | 3/2006 | Kim | C23C 14/50 |
| | | | 204/298.23 |
| 2009/0078204 A1* | 3/2009 | Kerr | C23C 16/45551 |
| | | | 118/728 |
| 2011/0305835 A1* | 12/2011 | Bertram, Jr. | C23C 16/45568 |
| | | | 427/255.23 |
| 2013/0043212 A1 | 2/2013 | De Graaf et al. | |

* cited by examiner

ATOMIC LAYER DEPOSITION APPARATUS

BACKGROUND OF THE INVENTION

The invention relates to an Atomic Layer Deposition, ALD, apparatus for applying material on a substrate.

TECHNICAL FIELD

The ALD apparatus is used to apply multiple atomic layers of a material on a substrate. Atomic layer deposition is a method for the deposition of ultrathin films for a variety of different target materials.

The ALD can be used in the manufacturing of solar cells and display devices. Atomic layer deposition differs from, for example, chemical vapour deposition in that with atomic layer deposition the different precursor gasses used are dosed alternatively or spatially separated. During the first process step or so called half-cycle a precursor gas is dosed which reacts with the substrate surface in a self-limited way resulting in the deposition of the first target material (i.e. tri-methyl-aluminium). During the second half cycle, a second precursor gas is dosed which reacts with the newly formed surface in a self-limiting way depositing the second target material (i.e. water). One full atomic layer deposition cycle results in the deposition of one (sub) monolayer of the target material (i.e. aluminium oxide). Due to the self-limiting growth behaviour of each ALD half cycle, the advantage of an ultimate control of the target layer thickness can be achieved.

A conventional spatially separated ALD apparatus for atomic layer deposition comprises a frame and an injector head provided with longitudinal slots for respectively supplying gasses to respective deposition spaces confined by the longitudinal slots and the substrate, the apparatus further comprises a movable carrier arranged to support the substrate for movement in a direction transverse to the longitudinal slots, the longitudinal slots are arranged besides each other in the moving direction of the substrate, the longitudinal slots for supplying respectively precursor gasses and reactive gasses are separated from each other by longitudinal slots for supplying an inert gas flow. These longitudinal slots and the inert gas flow also act as gas bearings to support the injector head on the substrate. The inert gas flow also serves to confine a reaction space between the injector head i.e. longitudinal slot and the substrate and the inert gas flows. Furthermore, the conventional apparatus is provided with a control device connected to the inert gas supply and arranged to adjust a working distance between a reference plane of the injector head and the surface of the substrate by adjusting the inert gas flows in the respective longitudinal slots.

The ALD apparatus can be used in manufacturing of solar cells to provide multiple atomic layers on the substrate. The substrate can be, for example, an ordinary glass sheet. The thickness of these ordinary glass sheet can vary over a length and/or width of the glass sheet and the surfaces of glass sheet may not be plan-parallel. For example, the glass sheet can have a wedge-like shape.

A drawback of the conventional device is that it is complex to maintain the gap height between the injector head and the surface of the substrates and to maintain a good gas separation when the substrate and the injector head are moved with respect to each other.

US 2009/0078204 discloses an apparatus for maintaining the alignment or positional relationship between at least two coating modules in an ALD system, the apparatus comprising a plurality of coating modules in a coating section, at least a first bar and a second bar for supporting the coating modules, and at least a first bar mounting structure and a second bar mounting structure for supporting the bars, wherein each of the coating modules are supported by the first bar and the second bar, and wherein the combination of the at least two coating modules and the first bar and the second bar define a coating section profile for the output faces of the coating modules. EP 2441860 discloses an apparatus for atomic layer deposition on a surface of a substrate, the apparatus comprising: a deposition member, a substrate table for supporting the substrate; a first reactant injector for supplying a first reactant; a second reactant injector for supplying a second reactant; a gas injector being arranged for creating, by means of gas injected by the gas injector, a gas barrier and optionally being arranged for creating a gas bearing; a heater for heating the gas that is to be injected by the gas injector and an additional heater for heating the deposition member and the substrate table, and for heating the substrate. The deposition member has a gas inlet for the gas that is to be injected by the gas injector. The heater is provided outside the deposition member.

SUMMARY OF THE INVENTION

It is an object of the invention to mitigate the above mentioned drawback and to provide an apparatus for an atomic layer deposition process that can handle substrates with a relatively large variation in thickness.

According to a first aspect of the invention this object is achieved by an apparatus for atomic layer deposition comprising a frame and an injector head provided with longitudinal slots for respectively supplying gasses to respective deposition spaces confined by the longitudinal slots and a substrate, wherein the longitudinal slots are directed transverse to a movement in a first direction (X) of the substrate with respect to the injector head. The apparatus further comprises a sub frame arranged to suspend the injector head; a movable carrier arranged to support the substrate for movement in the first direction; gas pads positioned at the sub frame outside the injector head between the sub frame and the moveable carrier to bear the sub frame on the moveable carrier for the movement in the first direction under the injector head, wherein the apparatus further comprises actuators for suspending the injector head from the sub frame; and a control device connected to the actuators and arranged to control the actuators to adjust a predetermined working distance between a reference plane of the injector head and the surface of the substrate and to adjust an orientation of the injector head corresponding to an orientation of the substrate.

In this arrangement the gas pads can be for example air bearing pads. The air bearing pads lift the sub frame in order to enable the movement of substrate (8) under the injector head (40) in the X-direction. Furthermore, the control device and the actuators can adjust the height between the injector head and the surface of the substrate at a predetermined distance towards the substrate. This adjustment of the height between the injector head and the surface of the substrate by the actuators can be performed independently from the flow of gasses through the longitudinal slots of the injector head and the flow of gas through the gas pads. So, that a working distance or height of a reaction chamber confined between the injector head and the substrate can be adjusted accurately and the substrate, for example, a glass sheet, can be moved under the injector head with a sufficient gap height, even when the surface of the substrate is for example undulated in a low degree.

In a further embodiment the ALD apparatus comprises a measuring device arranged to determine a distance between a reference plane of the injector head and a surface of the substrate in a second direction (Z). The control device connected to the actuators and arranged to control the actuators can in this arrangement adjust the working distance between a reference plane of the injector head and the surface of the substrate according to the determined distance and an orientation of the substrate. The reference plane of the injector head can be a surface of the injector head facing the substrate. The control device can adjust the working distance and the orientation of the injector head with respect to the substrate on basis of the determined distances via the actuators. This adjustment can be made, for example, after a first pass wherein the substrate is moved back and forth relatively to the injector head before an actual deposition is performed, in the first past the distances and the orientation of the surface of the substrate with respect to the injector head are then determined. The working distance can be, for example, determined from the distance from the highest point of the surface of the substrate to the reference plane of the injector head.

In an embodiment of the apparatus according to the invention the carrier is provided with bearing surfaces arranged at a border of the carrier opposite the gas pads to allow a movement of the substrate relatively with the respective longitudinal slots of the injector head in the first direction.

In an embodiment of the apparatus according to the invention the apparatus comprises a slab for supporting the carrier, a guide to direct the carrier in the first direction and a further air bearing positioned between the slab and the carrier for bearing the carrier. The gas bearing can comprise a pre-tensioned air bearing or a vacuum pre-tensioned air bearing.

In an embodiment of the apparatus according to the invention the further gas bearing is provided with a first longitudinal slot directed in the first direction in a first side of the carrier facing the slab; a second slot circumferential around the first longitudinal slot in the first side of the carrier; and exhaust holes outside the second slot arranged in the first side of the carrier. This arrangement provides a compact integration of the slab and the carrier, wherein the required air and vacuum connections can be made via hoses or tubes connected to the static slab.

In an embodiment of the apparatus according to the invention the actuators comprise a motor and a spindle mechanically connected to the motor.

In an embodiment of the apparatus according to the invention wherein the measuring device comprises a radiation source arranged to radiate a beam of coherent radiation, a radiation guide arranged to direct the beam to and from a surface of the substrate wherein the radiation guide further comprises a reference glass provided at an exit of the radiation guide in a surface of the injector head faced to the substrate; a beam splitter positioned between the radiation source and the radiation guide arranged to direct the radiation beam to the radiation guides and; to direct a radiation beam reflected from respectively the reference glass and the substrate to a radiation sensor arranged to receive the reflected radiation beams and to convert the received radiation beams in an electrical signal wherein the measuring device is further arranged to determine a distance between the reference glass and the substrate from the electric signals and to determine an orientation of the substrate with respect to the injector head. The radiation source can be a radiation source generating radiation with a wavelength in the range between 400-1200 nm including infra-red radiation. The radiation sources can be for example LEDs. The measuring device is based on interferometer principles well known to a person skilled in the art.

In an embodiment of the apparatus according to the invention the radiation guide comprises optical fibres to conduct the radiation beam from the radiation source to a guide tube, wherein one end of the tube is positioned outside of the apparatus facing away from the substrate and the other end is positioned in the injector head opposite to the surface of the substrate, wherein the reference glass is arranged at the other end. The guide tubes reduce an influence of infrared radiation inside the apparatus on the radiation sensors applied in the measuring device.

In an embodiment of the apparatus according to the invention the reference glass is integrated in the injector head. The reference glasses can be positioned near the longitudinal slots nearest to the border of the injector head. In that position the reference glass will be cleaned/flushed by the passing gas flows.

In an embodiment of the apparatus according to the invention the control device is further arranged to move, in a first pass, the substrate forth and back in the first direction relatively with respect to the injector head and to determine a height map and an orientation of the substrate from the measured distances.

In a further embodiment of the apparatus according to the invention the control device is further arranged to determine from the height map a working distance between the surface of the substrate and the injector head and to control the actuators to adjust the injector head to the determined working distance.

In further embodiment of the apparatus according to the invention the control device is further arranged to determine an orientation of the substrate and to control the actuators to adjust the injector head in correspondence with the determined orientation of the substrate. This arrangement can compensate for non parallel surfaces of the substrate.

Although the invention will be described with reference to a number of preferred embodiments, the invention is not limited thereto. The embodiments discussed below are only examples of possible interpretations of the invention and it will be clear to the person skilled in the art that the advantages of the invention can also be achieved in another way.

BRIEF DESCRIPTION OF THE DRAWING

The invention will be described in more detail with reference to the attached drawings, in which.

DETAILED DESCRIPTION OF THE PRESENT INVENTION

Figure 1:
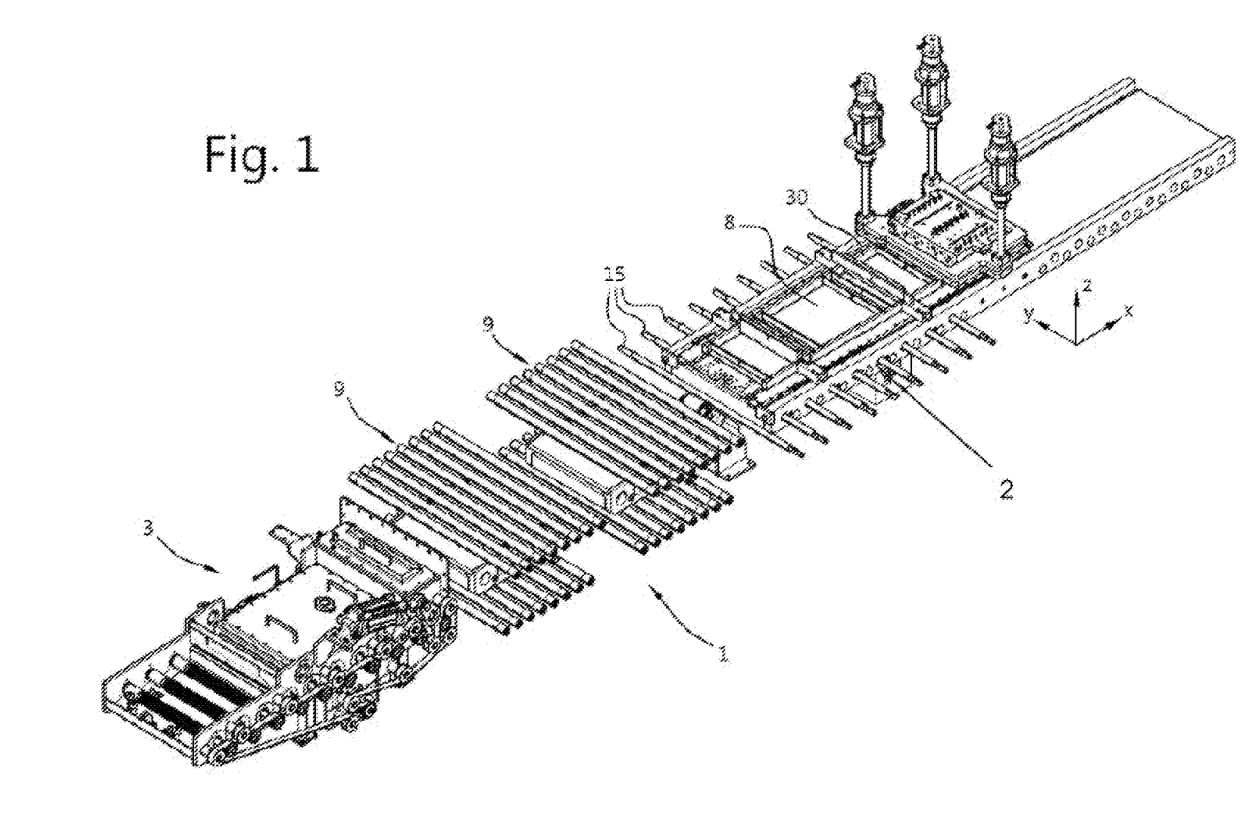
FIG. 1 diagrammatically shows a first view of an embodiment of an Atomic Layer Deposition, ALD, apparatus according to the invention.
Figure 2:
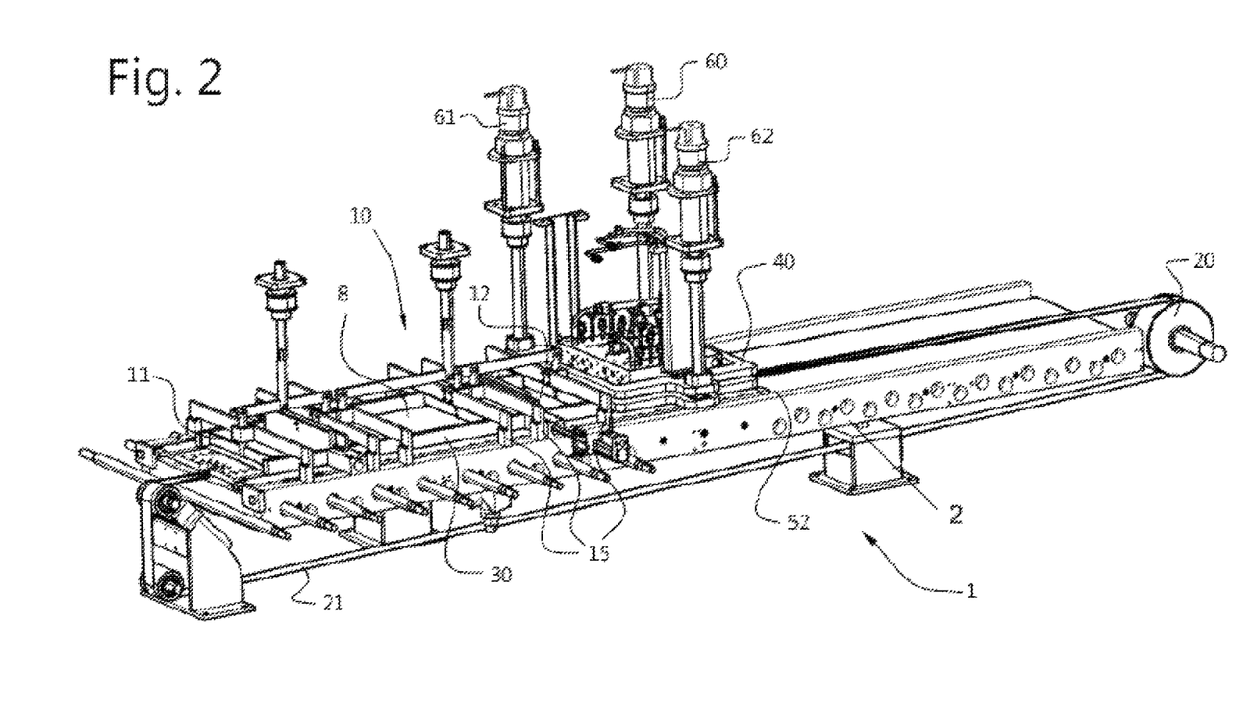
FIG. 2 diagrammatically shows a second view of the embodiment of ALD apparatus.

FIG. 1 and FIG. 2 diagrammatically show a first embodiment of atomic layer deposition, ALD, apparatus 1 according to the invention. The ALD apparatus can be used in the manufacturing of photovoltaic solar cells from a substrate. The substrate may contain, for example, glass and have a size of, for example, 60×40 cm, 120×60 cm, or 110×140 cm. The apparatus 1 comprises a housing (not shown) of layered material, for example, a stack of sheet steel, a heatproof insulating material, for example rock wool, and a graphite layer.

Furthermore, the ALD apparatus 1 may be provided with a frame 2 provided with an inlet port or load lock 3. The load lock 3 can be sealed and are provided with doors for allowing a substrate 8 in or out the ALD apparatus. The inlet port may also be made of steel, graphite, borosilicate or fused silica. The ALD apparatus 1 may furthermore be provided with electric heating elements, for example quartz elements 9 between the load lock and the injector head for producing a desired temperature. The temperature range within can be set in a range of, for example, 80 to 500° C.

FIG. 1 further shows a coordinate system with an X, Y and Z-axis. The X-axis is directed in a longitudinal direction in a horizontal plane, the Y-axis is perpendicular to the X-axis in the horizontal plane and the Z-axis is perpendicular to both the X and Y-axis. The ALD apparatus 1 is further provided with transport rollers 15 positioned in the frame 2 for transport of the substrate within the ALD apparatus in the X-direction. The transport rollers 15 may be made of fused silica and have a length of 80 cm and a diameter of 100 mm. Some of the transport rollers 15 may be provided with a drive (not shown). The transport rollers 15 can be rotably attached to the frame 2 to enable transport of the substrate 8 inside the ALD apparatus 1 to the gripper station 10.

In an embodiment the ALD apparatus 1 is provided with a carrier 30 for supporting the substrate 8 and two dummy plates 11, 12 of the same material as the substrate and having an equal thickness of the substrate, for, example glass. Furthermore, the ALD apparatus comprises a gripper station 10. The gripper station 10 is arranged to pick up the substrate 8 and to transport the substrate to the carrier 30.

The ALD apparatus 1 can be further provided with a slab 31 for supporting the carrier 30 and a gas bearing between the slab 31 and the carrier 30 for bearing the carrier on the slab in the X-direction. The gas can be for example nitrogen.

Figure 3A:
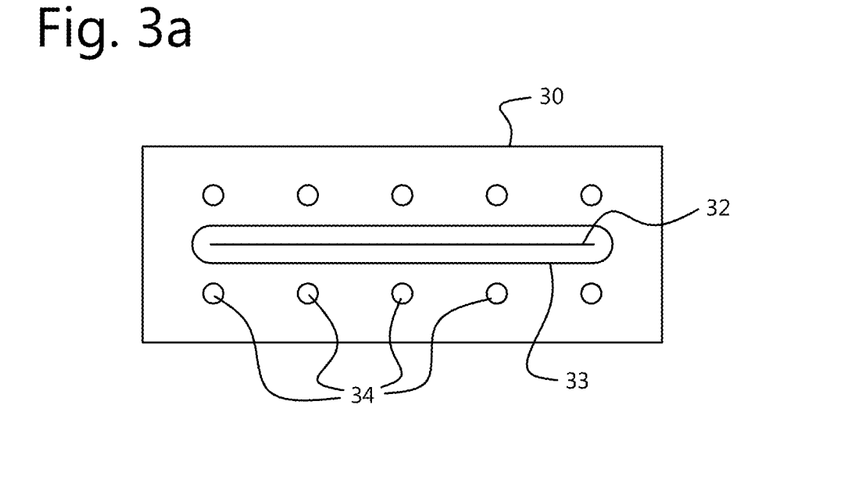
FIGS. 3A and 3B diagrammatically shows a carrier and a slab of an ALD apparatus.
Figure 3B:
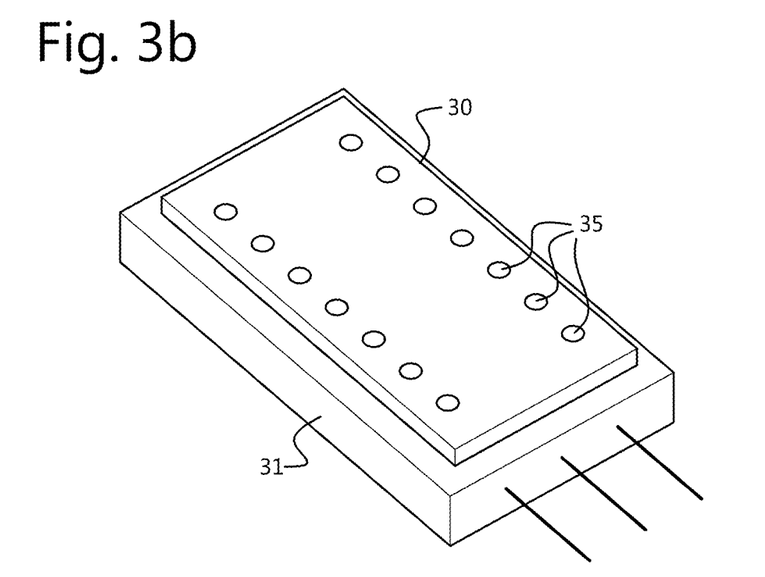

FIG. 3A shows schematically a bottom view of the carrier 30 and FIG. 3B shows schematically a top-side view of the carrier 30 and the slab 31. The carrier 30 can be a rectangular metal plate. The slab 31 can be provided with a guide to direct the carrier 30 in the X-direction. The gas bearing between carrier 30 and the slab 31 is provided with a longitudinal slot 32 in a first side of the carrier 30 directed to slab 31. The longitudinal slot 32 is directed in the X-direction and through the centre of the first side of the carrier, a zero-slot 33 that can be, for example, circumferentially provided around the longitudinal slot 32 and exhaust holes or vacuum pads 34 provided outside the zero-slot 33. The carrier 30 is further provided with a first channel connected to the longitudinal slot 32 for receiving pressurized gas at a first pressure higher than 1033 hPa, a second channel connected to the zero-slot 33 for receiving gas at a pressure of 1 hPa, and a third channel to connect the exhaust holes or the vacuum pads 34 to each other and to a vacuum. The vacuum, i.e. pressure is lower than 1 hPa.

In operation, a gas flow maintained through the gap between the flat surface of the slab 31 and the carrier 30 provides lift to the carrier and simultaneously acts as a seal because the gas flow from the area of high pressure towards the vacuum is restricted by the small dimensions of the gap so that the high pressure in the zero-slot 32 can be maintained. The gas flow can be used to pre-set the gas bearing i.e. gap height.

The opposite side of the first side of the carrier 30 for supporting the substrate is provided with exhaust holes 35 which are connected to each other and to a second vacuum via a fourth channel for clamping the substrate 8 on the carrier 30.

The ALD apparatus 1 is further provided with a drive belt 21 and a motor 20 connected to a control device 100 for moving the carrier 30 back and forth in the X-direction on the slab 31 of the ALD apparatus. The ALD apparatus 1 further comprises an injector head 40.

Figure 4:
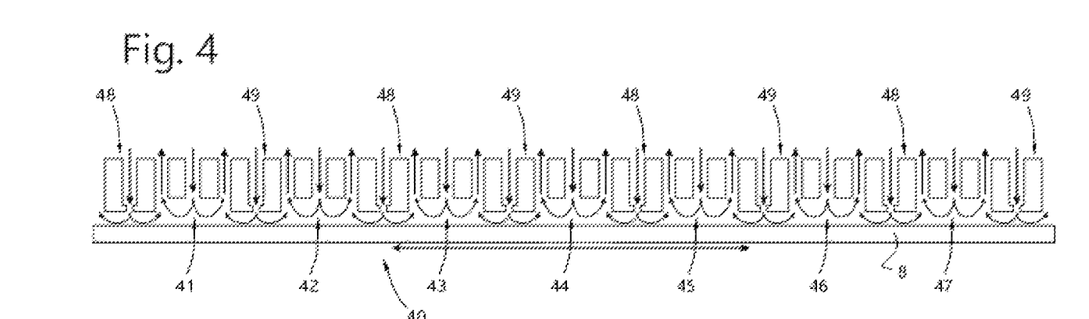
FIG. 4 diagrammatically shows an embodiment of an injector head for an ALD apparatus.

FIG. 4 shows an embodiment of the injector head 40 provided with eight longitudinal slots 48, 49 for respectively defining seven deposition spaces 41,42,43,44,45,46,47. The first deposition spaces 41,42,46,47 can be further provided with reactant supplies for supply of a first material deposition. The second deposition spaces 43, 44, 45 can be provided with precursor supplies. The longitudinal slots 48, 49 are arranged for supplying an inert gas flow to separate the deposition spaces from each other and the remainder of the space in the ALD apparatus. The longitudinal slots are directed in the Y-direction perpendicular to a moving direction, X-direction, of the substrate.

The inert gas can be nitrogen. The injector head wherein the deposition space are formed by inert gas flows is known per see from patent NL 2010893. However, in the known injector head the inert gas flows are also used for height adjustment between the injector head and the substrate, however the variation in height that can be adjusted is limited due to restriction in the gasflow through the longitudinal slots. Whereas, in the embodiment of the ALD apparatus according to the invention the precursor and reactant supplies can be designed without substantial flow restrictions to allow for plasma deposition. Thus, towards a surface of the substrate 8, plasma flow is unhindered by any flow restrictions.

Alternatively or additionally, at least one of a reactant gas, a plasma, laser generated radiation, and ultraviolet radiation, may be provided in the deposition space for reacting the precursor with the reactant gas after deposition of the precursor gas on at least part of the substrate surface in order to obtain the atomic layer on the at least part of the substrate surface.

Figure 5:
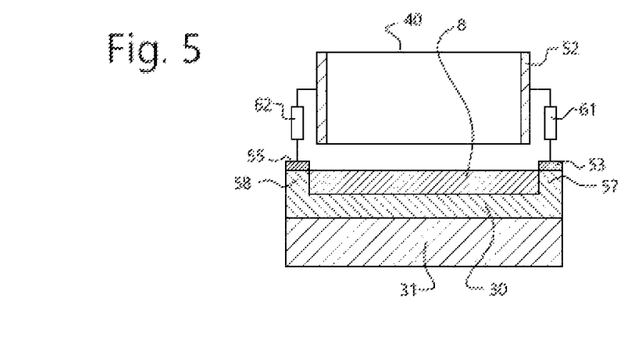
FIG. 5 diagrammatically shows a sub frame, a carrier and an injector head.

In an embodiment of the ALD apparatus according to the invention the ALD apparatus is provided with a sub frame 52 for suspending the injector head 40.

FIG. 5 shows a schematic side view of the arrangement of sub frame 52, the injector head 40, the carrier 30 and the slab 31.

Figure 6:
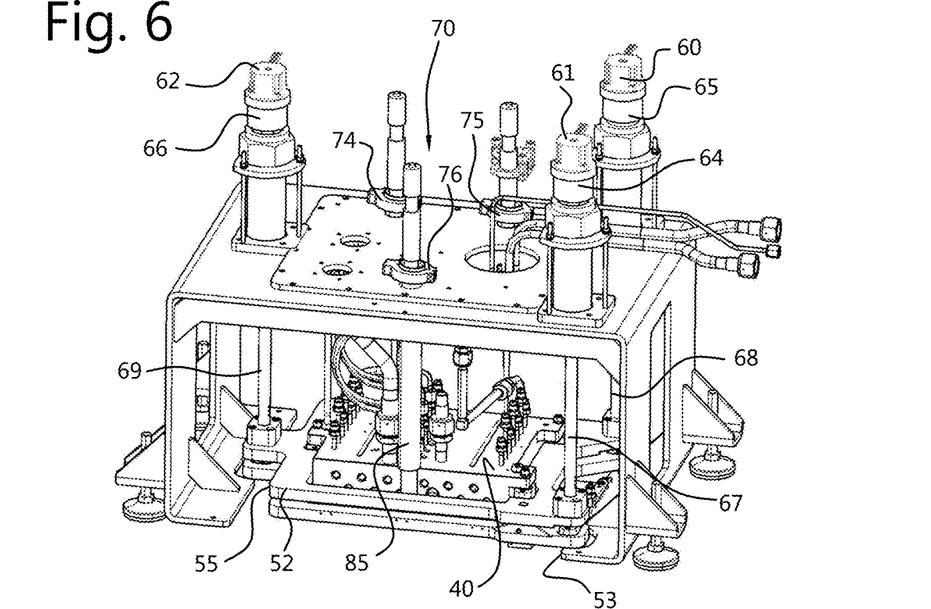
FIG. 6 diagrammatically shows a first perspective view of the sub frame, and the injector head.
Figure 7:
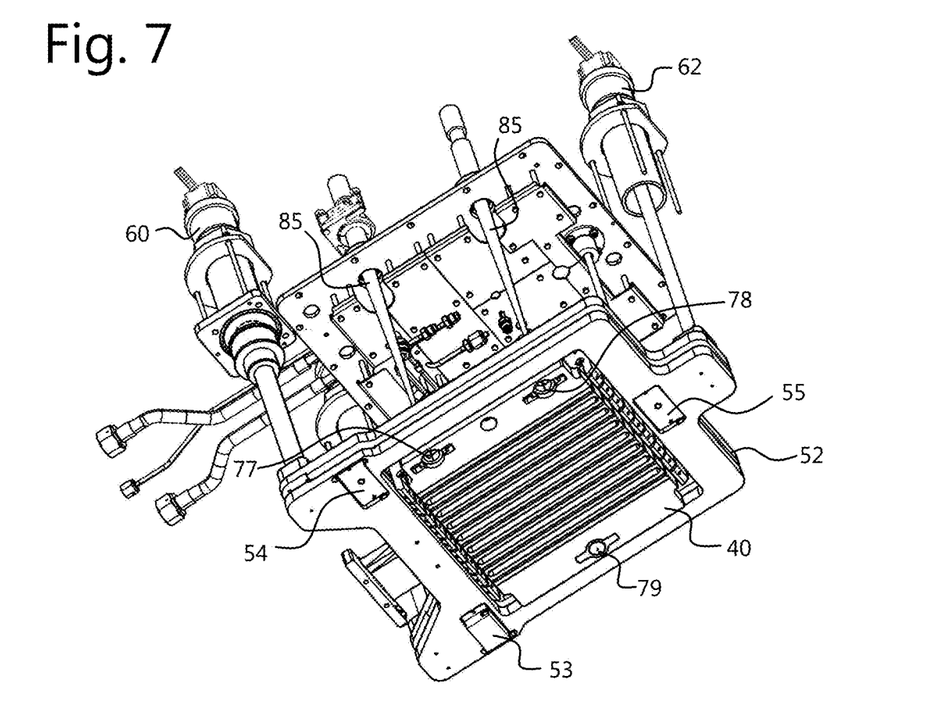
FIG. 7 diagrammatically shows a second perspective view of the sub frame, and the injector head.

FIGS. 6 and 7 show diagrammatically different side views of the arrangement of the sub frame 52, the slab 31, the carrier 30 and the injector head 40. The sub frame 52 is further provided with three gas pads 53, 54, 55, for lifting the sub frame 52 from the carrier 30. The gas pads 53, 54, 55 are positioned outside the injector head 40 and opposite a border of the carrier 30 outside the space for supporting the substrate 8. For example, two gas pads 53, 54 can be positioned at a first border in longitudinal direction and a third gas pad 55 can be positioned at the opposite border. The gas pads can be connected to a supply of nitrogen via a central channel.

Figure 9:
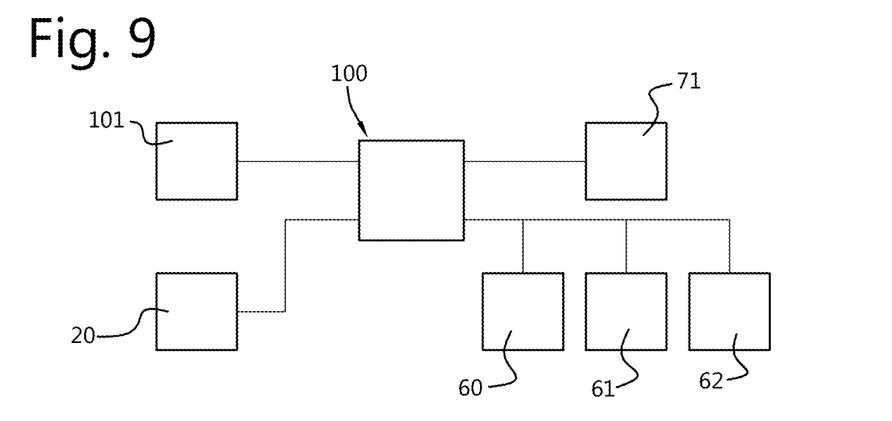
FIG. 9 diagrammatically shows a control device for an ALD apparatus.

Furthermore, the control device 100 comprises a gas flow control unit 101 for adjusting the gas flow through the gas pads to set a predetermined height between a reference surface of the sub frame and the carrier.

The carrier 30 is further provided with bearing surfaces 57, 58 at the borders opposite to the gas pads 53, 54, 55 of the sub frame 52, so that the substrate 8 can be moved forth and back under the respective longitudinal slots of the injector head 40 along the X-direction.

The side of the carrier 30 supporting the substrate 8 can be further provided with additional spaces for supporting the additional substrates 11, 12 or dummy substrates, the additional spaces are positioned in a longitudinal direction at opposite sides of the space for supporting the substrate 8. The dummy substrates 11, 12 confine the deposition spaces between the borders of the substrate and the injector head when the borders of the substrate 8 are moving under the injector head.

The sub frame 52 can be further provided with three actuators 60, 61, 62 to suspend the injector head 40 from the sub frame 52. The actuators 60,61,62 may comprise a motor 64,65,66, for example a stepper motor and a spindle 67,68, 69 mechanically coupled to the stepper motor. The control device 100 is further electrically connected to the actuators 60, 61, 62 and arranged to adjust the distances of between the sub frame 52 and the reference surface of the injector head 40 via the three actuators and therewith the height between the injector head 40 and the substrate 8 and the orientation of the injector head 40 with respect to the surface of the substrate 8. This arrangement of actuators 60, 61, 62 can adjust the height between the injector head and the surface of the substrate independently from the gasflows through the respective longitudinal slots 48, 49 and the gas flow through the gas pads 53, 54, 55.

In the embodiment according to the invention, the height of a deposition space formed between the substrate 8 and the injector head 40 can independently adjusted from the gas flow through the longitudinal slots 48,49 for supplying nitrogen for separating the deposition spaces and the flow of precursor and reaction gasses.

Figure 8:
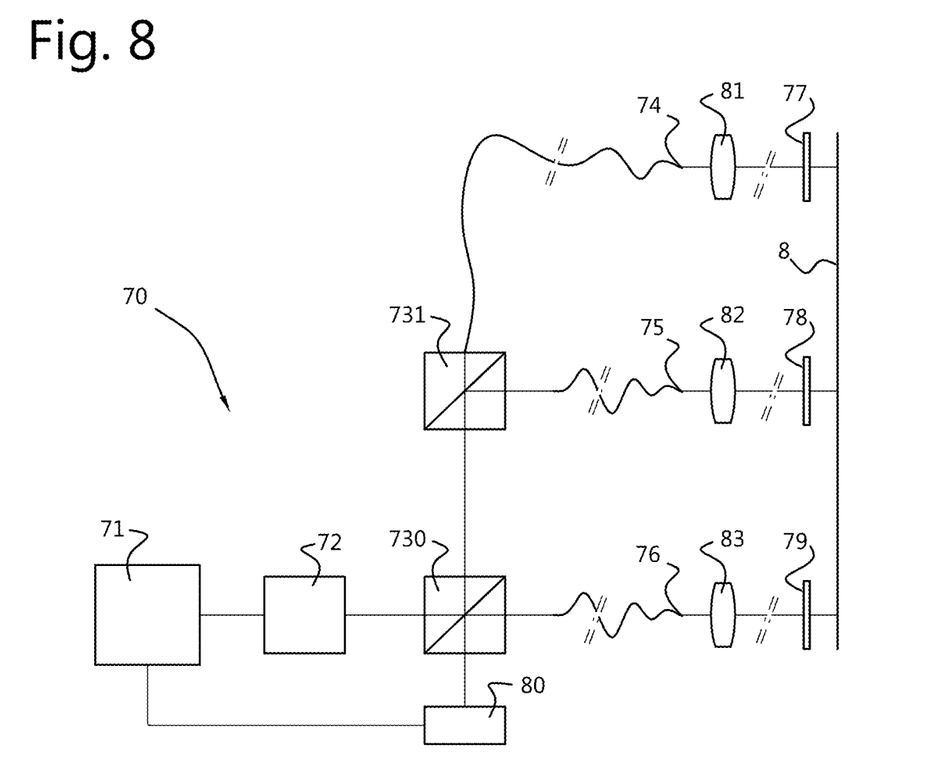
FIG. 8 diagrammatically shows a distance measuring device.

In an embodiment the ALD apparatus is further provided with a distance measuring device 70 for measuring the distance between a position on the surface of the substrate 8 and a reference plane of the injector head 40. The distance measuring device can be an optical distance measuring device. The reference plane can be a surface of the injector head facing the substrate.

FIG. 8 shows diagrammatically the optical measuring device 70. The optical measuring device can comprise three interferometers. The interferometers can be provided with a radiation source 72 for example, a solid state laser device arranged outside of the ALD apparatus 1, because an operating temperature inside the ALD apparatus may be higher than the maximum operating temperature of the solid state laser devices. The operating temperature inside the ALD apparatus can be, for example 350° C. The radiation sources can generate radiation with a wavelength between 400 to 1200 nm, including infra-red radiation.

The interferometer is further provided with two beam splitters 730,731 for obtaining three radiation beams and three radiation guides 74, 75, 76 arranged to direct the respective radiation beams from the beam splitters 730,731 to the surface of the substrate 8 faced to the injector head 40 and to direct the reflected radiation beams from the surface of the substrate 8 back to the beam splitters 730,731. The beam splitters 730,731,732 are further arranged to direct the reflected radiation beams to a radiation sensor 80. The radiation guides 74, 75, 76 may comprise optical fibres, e.g. glass fibres, and guide tubes.

The guide tubes can be positioned in the ALD apparatus, wherein the ends of the guide tubes facing the substrate 8 on the carrier can be arranged to coincide with the corner points of a triangle. FIG. 6 shows one of the guide tubes 85 mounted in the sub frame 52, one end of the guide tube 85 is positioned at an upper side of the ALD apparatus 1 facing away from the substrate 8 and the other end at the side of the injector head 80 directed to the substrate 8. The guide tubes 85 can be internally coated with a radiation absorbing coating to prevent mutual interference of the radiation beams and influence of infra-red radiation.

The radiation guides, for example, at the end of the guide tube 85 outside the ALD apparatus, can be further provided with a lens 81,82,83 for adjusting the focus of the respective radiation beams at the surface of the substrate 8. The radiation guides can be further provided with reference glass plates 77, 78, 79. The reference glass plate 77, 78,79 are arranged to reflect a part of the incoming radiation beam a reference radiation beam to the radiation sensor 70 via the beam splitter 730,731. The reference glass plates 77,78,79 can be incorporated in the injector head 40 at the side facing to the substrate 8, outside and near the outer longitudinal slots for supplying nitrogen gas. In this arrangement the nitrogen gas flow can be directed along the reference glass plate in order to prevent parasitic deposition on the reference glass plate.

The radiation sensor 80 is further electrically coupled to the sensor control device 71. The radiation sensor 80 is arranged to convert the incident radiation beams from the beam splitter 73 into an electric signal.

In operation, the radiation beam is direct to the substrate and a reference radiation beam reflected from the reference substrate interferes with the reflected radiation beam from the substrate 8 at the radiation sensor 80. The radiation sensor 80 converts the incoming interference pattern in the electric signal. The sensor control device 71 is further arranged to determine from the electric signal distances between the reference glasses 77,78,79 of the sub frame and the surface of the substrate 8. The optical distance measuring device is known per see and can be obtained from Precitec, Germany. The optical distance measuring device can measure differences in height of the substrate between 0 and 8 mm. The resolution of the optical measuring device is typically 1 to 2 micrometre.

The ALD apparatus may comprise a control device.

FIG. 9 shows diagrammatically a control device 100 for an ALD apparatus. Furthermore, FIG. 9 shows schematically the actuators 60,61,62, the gas flow controller 101 and the stepper motor 20. The control device can comprise a microcomputer for executing the operating programs. The control device 100 is electrically connected to the actuators 60,61,62, the optical measuring device 71, the air flow control controller 101 to control respectively the gas flow through the bearing pads 53,54,55 and/or the stepper motor 20 to adjust the direction and speed of the carrier 30.

In operation, in a first step the gripper station 10 in the ALD apparatus places a substrate 8 on the carrier 30 and, in a further step, the ALD apparatus is measuring, in a first pass of the substrate under the injector head 40, distances between three positions of the reference plane of the sub frame and the surface of the substrate at predetermined time intervals, while the substrate 8 is moving forth and back under the injector head 40 with a speed of, for example, 1 m/s. The control device 100 is further arranged to determine a height map of the surface of the substrate 8 from the measured distances and to determine a minimum distance of the injector head 40 to the substrate 8 at which the substrate 8 can be moved freely under the injector head. Furthermore, the orientation of the reference plane of the injector head can be determined from the determined height map.

In a next step, the control device 100 adjusts the working distance between the reference plane of the injector head 40 and the carrier 30 according to the determined minimum distance and the orientation of the reference plane. In this way, when in a next step, the substrate and carrier are moved back and forth under the injector head 40 the deviations in the height of reaction spaces formed between the respective longitudinal slots of the injector head 40 and the surface of the substrate 8 are minimized.

In the further steps the substrate 8 can be subsequently passed under the injector head 40, each portion of the surface of the substrate 8 is subsequently exposed to the respective precursor and reaction gasses received via the subsequent longitudinal slots of the injector head.

In a single pass a (sub) monolayer of the target material can be applied on the substrate, the thickness of that (sub) monolayer is typically between 0.005 and 0.2 nm. In practice, the thickness of a functional layer about 25 nm. The number of passes to obtain that thickness can be for example 125 and 500.

The speed at which the substrate 8 and the carrier 30 moves under the injector head can be for example 1 m/s.

The present invention is not limited to the preferred embodiments thereof which are described herein. Rather, the rights sought are defined by the following claims, which allow for numerous modifications.

The invention claimed is:

1. An apparatus for atomic layer deposition comprising:
a frame;
an injector head provided at the frame, the injector head having longitudinal slots configured to respectively supply gasses to respective deposition spaces confined by the longitudinal slots and a substrate, the longitudinal slots extending transversely to a first direction of the substrate with respect to the injector head;
a movable carrier configured to support the substrate for the movement in the first direction;
a sub frame provided with a plurality of actuators configured to suspend the injector head from the sub frame;
gas pads disposed at an edge of the sub frame outside the injector head, the gas pads being configured to bear the sub frame on the movable carrier for the movement in the first direction of the substrate under the injector head;
at least one interferometer configured to measure a working distance between a position on a surface of the substrate and a reference plane of the injector head;
a computer connected to the actuators and the at least one interferometer and configured to control the working distance between the reference plane of the injector head and the substrate, the computer being configured to adjust an orientation of the injector head corresponding to a determined orientation of the substrate.

2. The apparatus according to claim 1, wherein the at least one interferometer comprises a radiation source configured to radiate beams of coherent radiation,
a radiation guide configured to direct each of the beams to and from a surface of the substrate, the radiation guide comprising a reference glass provided at an exit of the radiation guide in a surface of the injector head facing the substrate, the reference glass being at the reference plane of the injector head,
a beam splitter positioned between the radiation source and the radiation guide and configured to direct each of the radiation beams to the radiation guide and to direct radiation beams respectively reflected from the reference glass and the substrate to a radiation sensor, the radiation sensor configured to receive the reflected radiation beams and to convert the received radiation beams into electrical signals,
wherein the at least one interferometer is configured to determine the at least one working distance between the reference glass and the substrate from the electrical signals and to determine an orientation of the substrate with respect to the injector head in a second direction.

3. The apparatus according to claim 2, wherein the actuators comprise a motor and a spindle mechanically connected to the motor.

4. The apparatus according to claim 2, wherein the radiation guide comprises an optical fiber to conduct the radiation beam from the radiation source to a guide tube, one end of the guide tube being positioned outside of the apparatus facing away from the substrate and the other end of the guide tube being positioned in the injector head opposite to the surface of the substrate, and
wherein the reference glass is disposed at the other end in the injector head facing the substrate.

5. The apparatus according to claim 2, wherein the at least one working distance comprises a plurality of working distances, and
wherein the computer is configured, in a first pass, to move the substrate forth and back in the first direction relatively with respect to the reference plane of the injector head and to determine the plurality of working distances.

6. The apparatus according to claim 5, wherein the computer is further configured to determine, from the plurality of working distances, a minimum working distance between the surface of the substrate and the reference plane of the injector head at which the substrate is able to move freely under the injector head and to control the actuators to adjust the injector head in correspondence with the minimum working distance.

7. The apparatus according to claim 2, wherein the carrier is provided with bearing surfaces disposed at a border of the carrier opposite the gas pads to allow a movement of the substrate under the respective longitudinal slots of the injector head in the first direction.

8. The apparatus according to claim 7, further comprising a slab configured to support the carrier, the slab being provided with a guide to direct the carrier in the first direction and a gas bearing positioned between the slab and the carrier and configured to bear the carrier.

9. The apparatus according to claim 7, wherein the actuators comprise a motor and a spindle mechanically connected to the motor.

10. The apparatus according to claim 2, further comprising a slab configured to support the carrier, the slab being provided with a guide to direct the carrier in the first direction and a gas bearing positioned between the slab and the carrier and configured to bear the carrier.

11. The apparatus according to claim 1, wherein the carrier is provided with bearing surfaces disposed at a border of the carrier opposite the gas pads to allow a movement of the substrate under the respective longitudinal slots of the injector head in the first direction.

12. The apparatus according to claim 11, further comprising a slab configured to support the carrier, the slab being provided with a guide to direct the carrier in the first direction and a gas bearing positioned between the slab and the carrier and configured to bear the carrier.

13. The apparatus according to claim 11, wherein the actuators comprise a motor and a spindle mechanically connected to the motor.

14. The apparatus according to claim 1, further comprising a slab configured to support the carrier, the slab being provided with a guide to direct the carrier in the first direction and a gas bearing positioned between the slab and the carrier and configured to bear the carrier.

15. The apparatus according to claim 14, wherein the gas bearing is provided with a first longitudinal slot directed in the first direction in a first side of the carrier facing the slab,
a second slot circumferential around the first longitudinal slot in the first side, and
exhaust holes outside the second slot arranged in the first side.

16. The apparatus according to claim 15, wherein the actuators comprise a motor and a spindle mechanically connected to the motor.

17. The apparatus according to claim 14, wherein the actuators comprise a motor and a spindle mechanically connected to the motor.

* * * * *